(12) United States Patent
Chang (10) Patent No.: US 10,649,012 B1
(45) Date of Patent: May 12, 2020

(54) TRANSMISSION INTERFACE MODULE AND SIGNAL TRANSMISSION METHOD

(71) Applicant: ALTEK SEMICONDUCTOR CORPORATION, Hsinchu (TW)

(72) Inventor: Ching-yen Chang, Hsinchu (TW)

(73) Assignee: ALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/517,492

(22) Filed: Jul. 19, 2019

(30) Foreign Application Priority Data

Nov. 28, 2018 (TW) .................................. 107142493

(51) Int. Cl.
*H03M 1/12* (2006.01)
*G01R 19/25* (2006.01)
*H03K 17/00* (2006.01)
*G09G 3/36* (2006.01)
*H04N 21/63* (2011.01)
*H04B 3/54* (2006.01)

(52) U.S. Cl.
CPC ..... *G01R 19/2509* (2013.01); *G01R 19/2503* (2013.01); *H03K 17/005* (2013.01); *H03M 1/1205* (2013.01); *G09G 3/3677* (2013.01); *G09G 2330/021* (2013.01); *H03M 1/12* (2013.01); *H04B 3/54* (2013.01); *H04N 21/631* (2013.01)

(58) Field of Classification Search
CPC . H03M 1/12; G09G 3/3677; G09G 2330/021; H04N 21/631; H04B 3/54

USPC ........... 341/155; 348/554; 345/213; 375/259
See application file for complete search history.

(56) References Cited

U.S. PATENT DOCUMENTS 9,727,786 B2    8/2017  Lee et al.
2017/0032757 A1*  2/2017  Itoigawa ................... H03L 7/00

FOREIGN PATENT DOCUMENTS

| CN | 205665697 U | 10/2016 |
| CN | 107220208 A | 9/2017 |
| TW | I554095 B | 10/2016 |
| TW | I591601 B | 7/2017 |
| TW | I615008 B | 2/2018 |

* cited by examiner

*Primary Examiner* — Joseph J Lauture
(74) *Attorney, Agent, or Firm* — Li & Cai Intellectual Property (USA) Office (57) ABSTRACT

A transmission interface module includes a receiving unit, a transmitting unit, a multiplexer, and a processing unit. An output terminal and a control terminal of the receiving unit are electrically connected to the processing unit. The input terminal and the control terminal of the transmitting unit are electrically connected to the processing unit, and the control terminal of the multiplexer is electrically connected to the processing unit. The transmission interface module respectively adjusts a turn-on state or a turn-off state of the analog power terminal, the digital power terminal, the processing unit, the receiving unit, the transmitting unit, and the multiplexer through a plurality of operation modes to transmit the detecting signals.

20 Claims, 9 Drawing Sheets

TRANSMISSION INTERFACE MODULE AND SIGNAL TRANSMISSION METHOD

CROSS-REFERENCE TO RELATED PATENT APPLICATION

This application claims the benefit of priority to Taiwan Patent Application No. 107142493, filed on Nov. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transmission interface module and a signal transmission method, and more particularly to a transmission interface module and a signal transmission method with low power consumption.

BACKGROUND OF THE DISCLOSURE

In mobile devices, image sensor of the camera module can directly communicate with the processor through the MIPI D-PHY interface. However, as requirements for the image are getting higher, so that even though directly transmitting the detecting signal of the image sensor to the processor has become a go-to solution for low-order or mid-range mobile devices, the requirements for high-order images still cannot be met. Therefore, disposing a transmission interface module between the camera module and the processor for pre-processing the image signals has become a trend in relevant design. However, the transmission interface module additionally implemented in the circuit also results in additional power consumption, which increases the burden of the mobile device.

Therefore, providing a transmission interface module with low power consumption has become an important issue in the industry.

SUMMARY OF THE DISCLOSURE

In response to the above-referenced technical inadequacies, the present disclosure provides a transmission interface module.

The transmission interface module is electrically connected to a sensor and an application processor. The transmission interface module includes a signal input terminal, a signal output terminal, an analog power terminal, a digital power terminal, a receiving unit, a transmitting unit, a multiplexer, and a processing unit. The signal input terminal is electrically connected to the sensor and receives a plurality of detecting signals transmitted by the sensor. The signal output terminal is electrically connected to the application processor, and outputs the plurality of detecting signals to the application processor. The analog power terminal is electrically connected to a first voltage. The digital power terminal is electrically connected to a second voltage. The receiving unit includes an input terminal, an output terminal, and a control terminal. The input terminal of the receiving unit is electrically connected to the signal input terminal. The transmitting unit includes an input terminal, an output terminal, and a control terminal. The multiplexer includes a first input terminal, a second input terminal, a control terminal, and an output terminal. The first input terminal of the multiplexer is electrically connected to the signal input terminal. The second input terminal of the multiplexer is electrically connected to the output terminal of the transmitting unit, and the output terminal of the multiplexer is electrically connected to the signal output terminal. The processing unit is electrically connected to the receiving unit, the transmitting unit, and the multiplexer. The processing unit receives the second voltage for operation. The output terminal and the control terminal of the receiving unit are electrically connected to the processing unit, and the input terminal and the control terminal of the transmitting unit are electrically connected to the processing unit. The control terminal of the multiplexer is electrically connected to the processing unit. The first voltage is applied to provide electrical energy for operation of the receiving unit, the transmitting unit, and the multiplexer. The transmission interface module respectively adjusts a turn-on state or a turn-off state of the analog power terminal, the digital power terminal, the processing unit, the receiving unit, the transmitting unit, and the multiplexer by a plurality setting of operation modes to transmit the detecting signals.

In certain embodiments, the present disclosure provides a signal transmission method using a transmission interface module. The transmission interface module is electrically connected to a sensor and an application processor, and the transmission interface module receives a plurality of detecting signals of the sensor. The transmission interface module includes a signal input terminal, a signal output terminal, an analog power terminal, a digital power terminal, a receiving unit, a transmitting unit, a multiplexer, and a processing unit. The signal input terminal is electrically connected to the sensor, and receives the detecting signals transmitted by the sensor. The signal output terminal is electrically connected to the application processor, and outputs the detecting signals to the application processor. The receiving unit is electrically connected to the signal input terminal and the processing unit, and the transmitting unit is electrically connected to the multiplexer and the processing unit. The multiplexer is electrically connected to the signal input terminal, the signal output terminal, and the processing unit. The signal transmission method includes: setting an operation mode of the transmission interface module; adjusting a turn-on state or a turn-off state of the analog power terminal, the digital power terminal, the processing unit, the receiving unit, the transmitting unit, and the multiplexer through the operation mode of the transmission interface module; and transmitting the detecting signals.

Therefore, the transmission interface module provided by the present disclosure can greatly reduce power consumption by turning on or turning off components, such as the receiving unit, the transmitting unit, the multiplexer, and the processing unit. Furthermore, the heat dissipation efficiency is also improved, and more designs can be provided for customers through multiple operation modes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
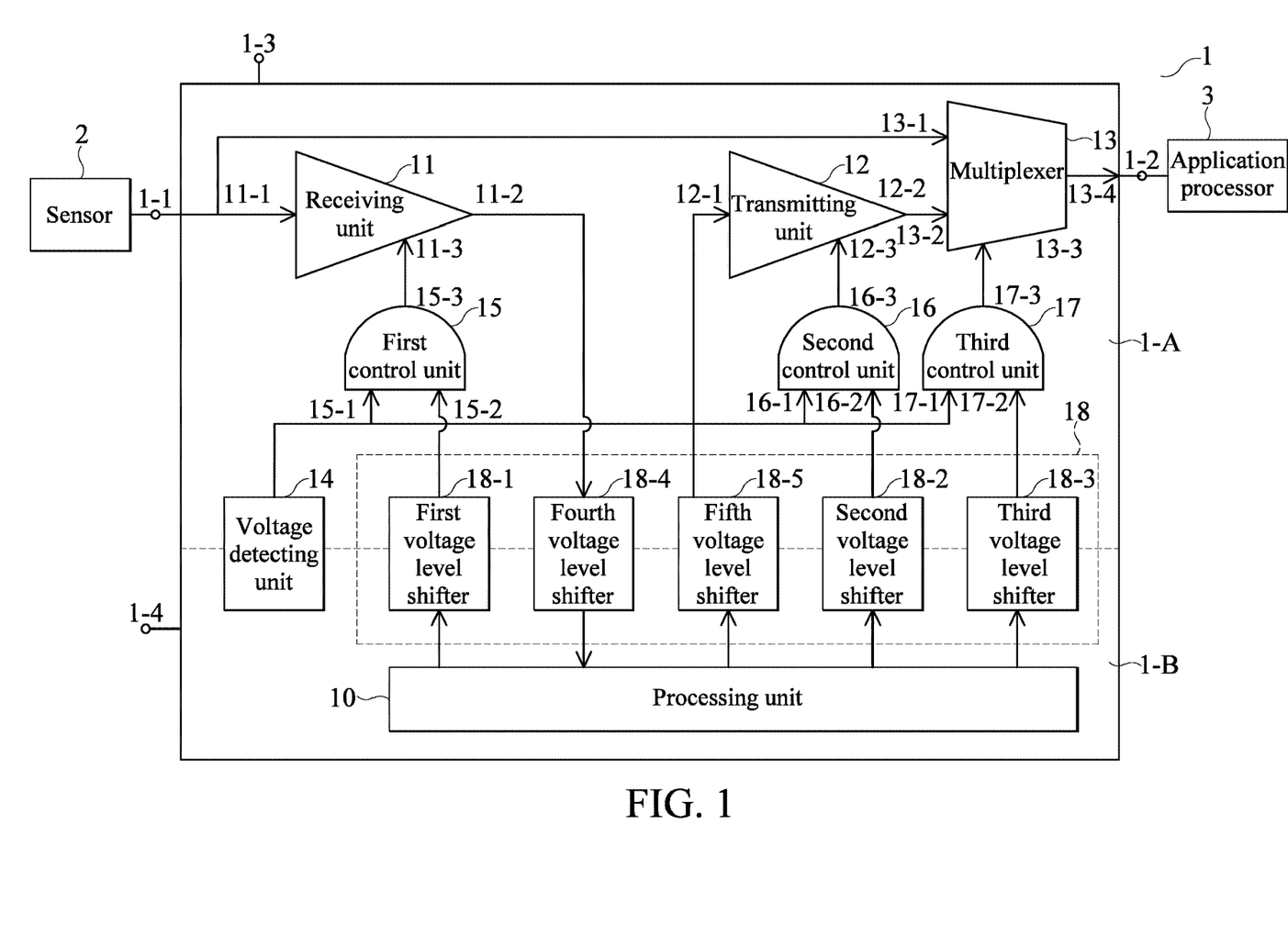
FIG. 1 is a block diagram of a transmission interface module connected to a sensor and an application processor according to a first embodiment of the present disclosure.

Referring to FIG. 1, FIG. 1 is a block diagram of a transmission interface module connected to a sensor and an application processor according to an embodiment of the present disclosure.

In the embodiment, the transmission interface module 1 is electrically connected to a sensor 2 and an application processor 3. The sensor 2 is an image sensor, and the application processor 3 is a processor processing the image signals. An interface between the sensor 2 and the transmission interface module 1 and an interface between the transmission interface module 1 and the application processor 3 are connected with each other through the Mobile Industry Processor Interface D-physical interfaces (MIPI D-PHY).

The transmission interface module 1 includes a signal input terminal 1-1, a signal output terminal 1-2, an analog power terminal 1-3, and a digital power terminal 1-4. The signal input terminal 1-1 is electrically connected to the sensor 2, and receives a plurality of detecting signals transmitted by the sensor 2. The signal output terminal 1-2 is electrically connected to the application processor 3, and outputs the plurality of detecting signals to the application processor 3. The analog power terminal 1-3 is electrically connected to a first voltage (not shown). The digital power terminal 1-4 is electrically connected to a second voltage (not shown). In the embodiment, the first voltage (not shown) is 1.8V, and the second voltage (not shown) is 0.9V.

In the embodiment, the transmission interface module 1 includes an analog component area 1-A and a digital component area 1-B. The first voltage (not shown) received by the analog power terminal 1-3 is applied for the electrical energy of components of the analog component area 1-A. In other words, the first voltage (not shown) is used for the operation of the receiving unit 11, the transmitting unit 12, and the multiplexer 13.

The second voltage (not shown) received by the digital power terminal 1-4 is the electrical energy supplied to components of the digital component area 1-B.

Furthermore, the transmission interface module 1 further includes a processing unit 10, a receiving unit 11, a transmitting unit 12, a multiplexer 13, a voltage detecting unit 14, a first control unit 15, a second control unit 16, a third control unit 17, and a voltage level conversion module 18.

The receiving unit 11 includes an input terminal 11-1, an output terminal 11-2, and a control terminal 11-3. The input terminal 11-1 of the receiving unit 11 is electrically connected to the signal input terminal 1-1.

The transmitting unit 12 includes an input terminal 12-1, an output terminal 12-2, and a control terminal 12-3.

The multiplexer 13 includes a first input terminal 13-1, a second input terminal 13-2, a control terminal 13-3, and an output terminal 13-4. The first input 13-1 of the multiplexer 13 is electrically connected to the signal input terminal 1-1. The second input 13-2 of the multiplexer 13 is electrically connected to the output terminal 12-2 of the transmitting unit 12. The output terminal 13-4 of the multiplexer 13 is electrically connected to the signal output terminal 1-2.

The processing unit 10 is electrically connected to the receiving unit 11, the transmitting unit 12, and the multiplexer 13. The processing unit 10 receives a second voltage (not shown) for operation.

In the embodiment, the output terminal 11-2 and the control terminal 11-3 of the receiving unit 11 are electrically connected to the processing unit 10. The input terminal 12-1 and the control terminal 12-3 of the transmitting unit 12 are electrically connected to the processing unit 10. The control terminal 13-3 of the multiplexer 13 is electrically connected to the processing unit 10.

In the embodiment, the transmission interface module 1 respectively adjusts a turn-on state and a turn-off state of the analog power terminal 1-3, the digital power terminal 1-4, the processing unit 10, the receiving unit 11, and the transmitting unit 12 for transmission of the detecting signals through a plurality of operation modes of the transmission interface module 1.

In the embodiment, the voltage detecting unit 14 is used for detecting the first voltage (not shown) of the analog power terminal 1-3 and the second voltage (not shown) of the digital power terminal 1-4. In other words, the voltage detecting unit 14 detects whether the analog element region 1-A and the digital element region 1-B have power or not. In the embodiment, since the signals of the analog element region 1-A and the digital element region 1-B cannot be interchanged with each other, the signals of the analog element region 1-A and the digital element region 1-B are converted by the voltage level conversion module 18.

In the embodiment, the voltage level conversion module 18 includes a first voltage level shifter 18-1, a second voltage level shifter 18-2, a third voltage level shifter 18-3, a fourth voltage level shifter 18-4, and a fifth voltage level shifter 18-5. In the embodiment, the first voltage level shifter 18-1, the second voltage level shifter 18-2, the third voltage level shifter 18-3, the fourth voltage level shifter 18-4, and the fifth voltage level shifter 18-5 are digital-analog signal voltage level shifters, in other words, the voltage level shifters are configured for converting the digital voltage into the analog voltage, or converting the analog voltage into the digital voltage. In the embodiment, the first voltage level shifter 18-1, the second voltage level shifter 18-2, the third voltage level shifter 18-3, the fourth voltage level shifter 18-4, and the fifth voltage level shifter 18-5 are disposed between the analog element region 1-A and the digital element region 1-B as signal transmission elements between the analog element region 1-A and the digital element region 1-B.

The first control unit 15 includes a first input terminal 15-1, a second input terminal 15-2, and an output terminal 15-3. The second input terminal 15-2 of the first control unit 15 is electrically connected to the processing unit 10 through the first voltage level shifter 18-1. The output terminal 15-3 of the first control unit 15 is electrically connected to the control terminal 11-3 of the receiving unit 11.

The second control unit 16 includes a first input 16-1, a second input 16-2, and an output 16-3. The second input terminal 16-2 of the second control unit 16 is electrically connected to the processing unit 10 through the second voltage level shifter 18-2. The output terminal 16-3 of the second control unit 16 is electrically connected to the control terminal 12-3 of the transmitting unit 12.

The third control unit 17 includes a first input terminal 17-1, a second input terminal 17-2, and an output terminal 17-3. The second input terminal 17-2 of the third control unit 17 is electrically connected to the processing unit 10 through the third voltage level shifter 18-3. The output terminal 17-3 of the third control unit 17 is electrically connected to the control terminal 13-3 of the multiplexer 13.

In the embodiment, the voltage detecting unit 14 is electrically connected to the first input terminal 15-1 of the first control unit 15, the first input terminal 16-1 of the second control unit 16, and the third control unit 17 of the first input terminal 17-1.

According to the above, the output terminal 15-3 of the first control unit 15, the output terminal 16-3 of the second control unit 16, and the output terminal 17-3 of the third control unit 17 are electrically connected to the receiving unit 11, respectively. The transmitting unit 12 and the multiplexer 13 transmit control signals to the receiving unit 11, the transmitting unit 12, and the multiplexer 13.

The first control unit 15 receives the signal of the voltage detecting unit 14 and the signal transmitted by the processing unit 10 through the first voltage level shifter 18-1 to output a control signal for controlling the receiving unit 11. The second control unit 16 receives the signal of the voltage detecting unit 14 and the signal transmitted by the processing unit 10 through the second voltage level shifter 18-2 to output a control signal for controlling the transmitting unit 12.

The third control unit 17 receives the signal of the voltage detecting unit 14 and the signal transmitted by the processing unit 10 through the third voltage level shifter 18-3 to output a control signal for controlling the multiplexer 13.

In other words, in the embodiment, the turn-on state or the turn-off state of the receiving unit 11, the transmitting unit 12, and the multiplexer 13 are determined based on the control signals of the voltage detecting unit 14 and the processing unit 10.

In the embodiment, the fourth voltage level shifter 18-4 is electrically connected to the output terminal 11-2 of the receiving unit 11 and the processing unit 10. The fifth voltage level shifter 18-5 is electrically connected to the input terminal 12-1 of the transmitting unit 12 and the processing unit 10.

Figure 2:
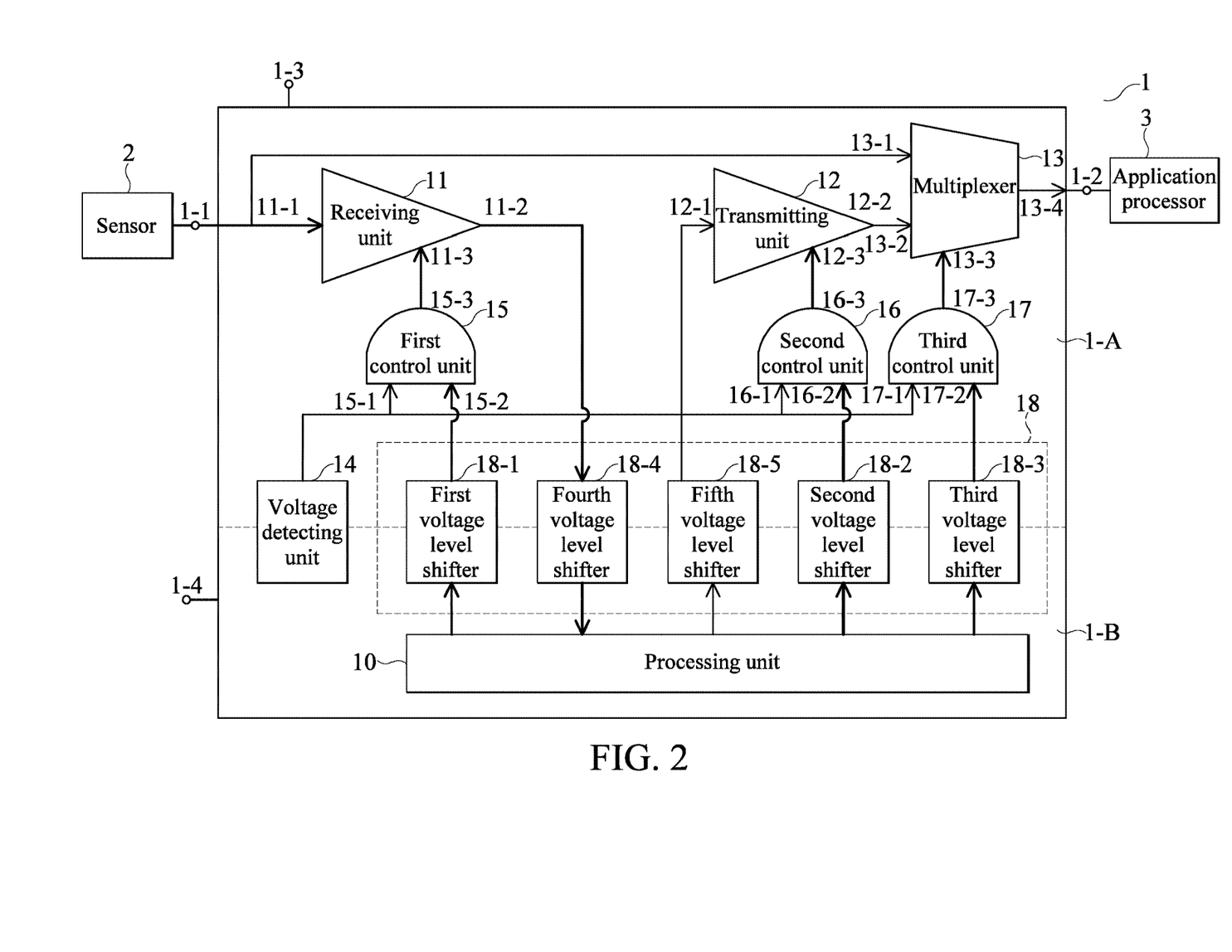
FIG. 2 is a block diagram showing the transmission interface module in a first mode according to the first embodiment of the present disclosure.
Figure 3:
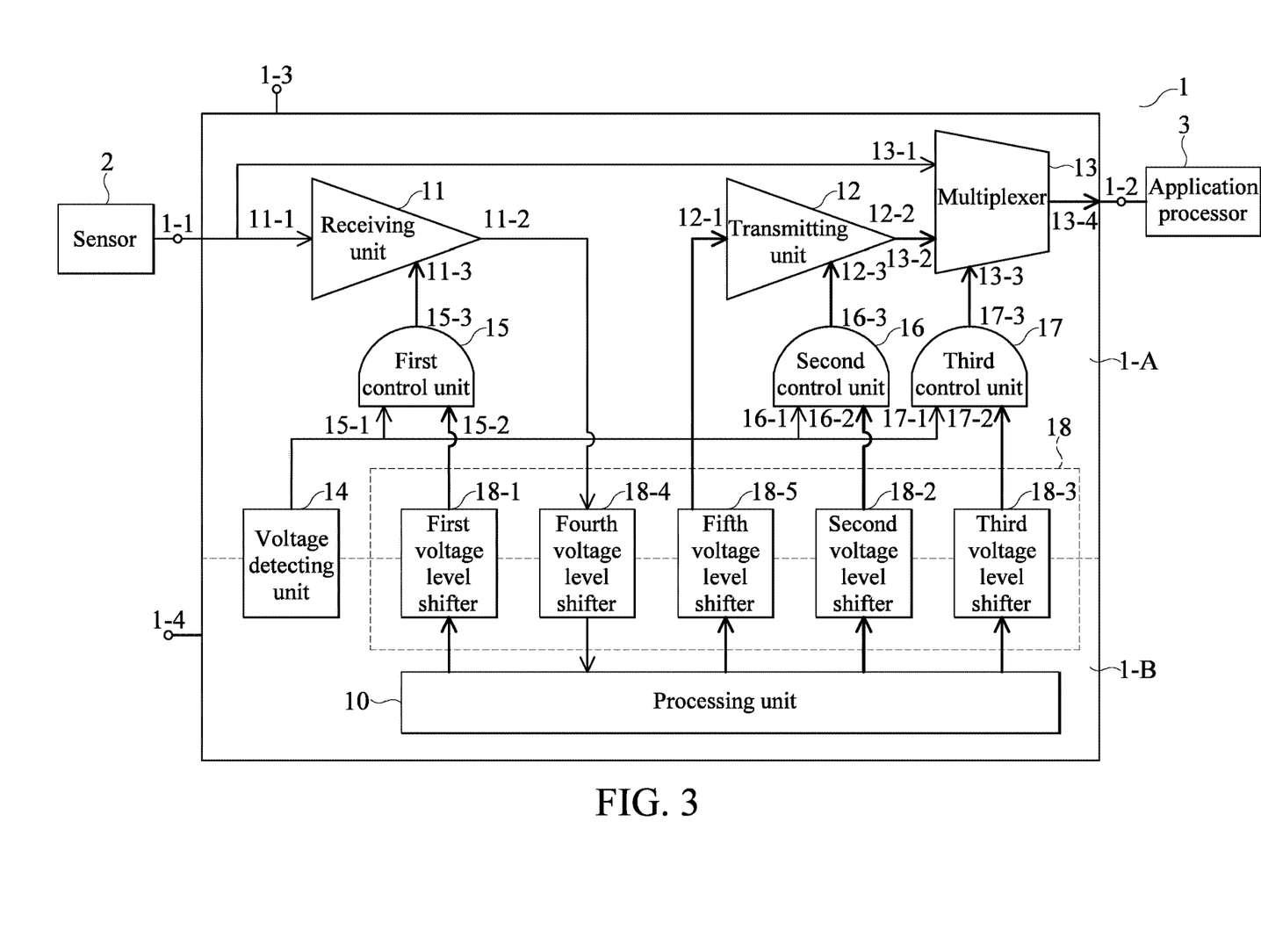
FIG. 3 is a block diagram showing the transmission interface module in a second mode according to the first embodiment of the present disclosure.
Figure 4:
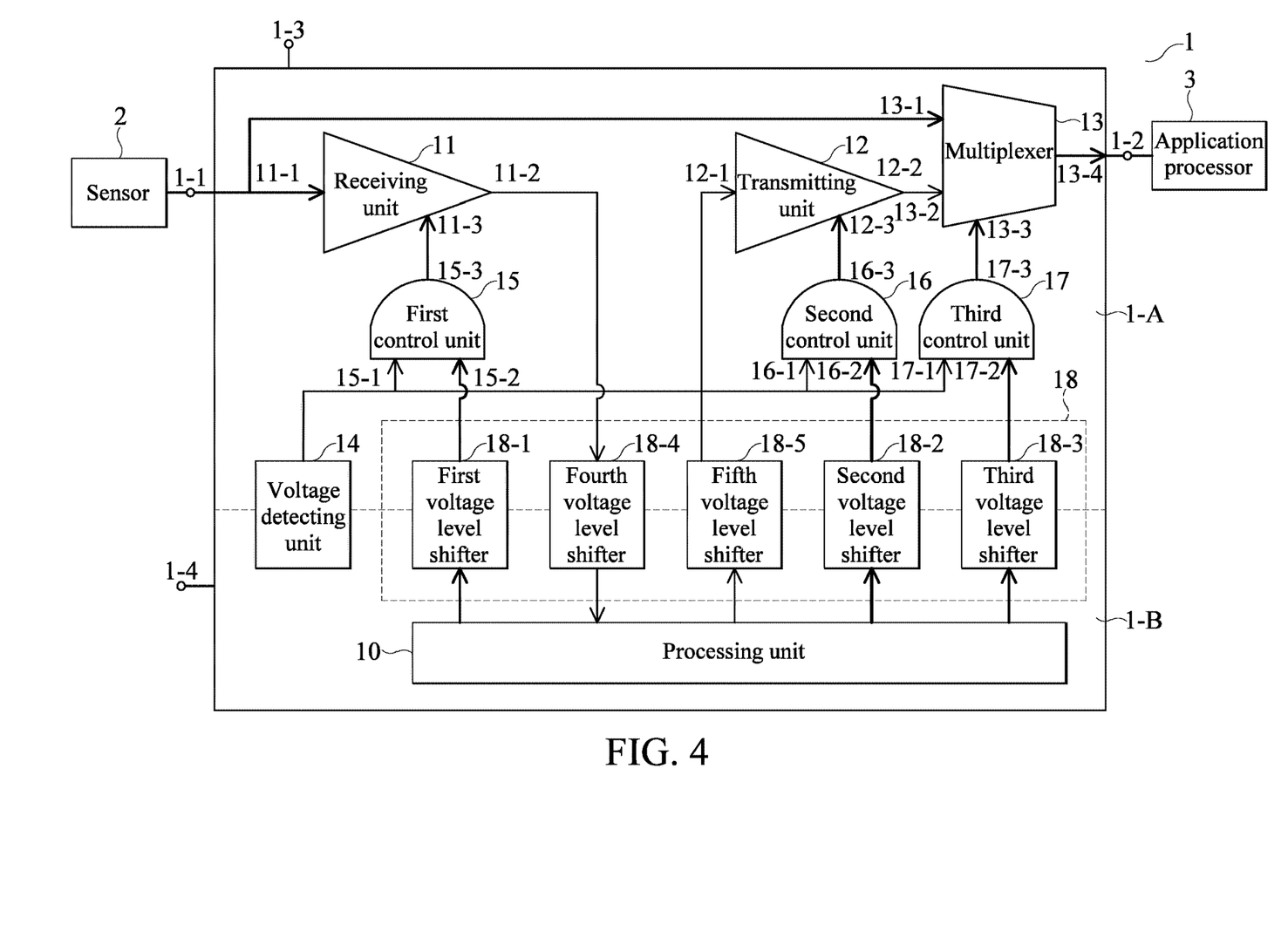
FIG. 4 is a block diagram showing the transmission interface module in a third mode according to the first embodiment of the present disclosure.
Figure 5:
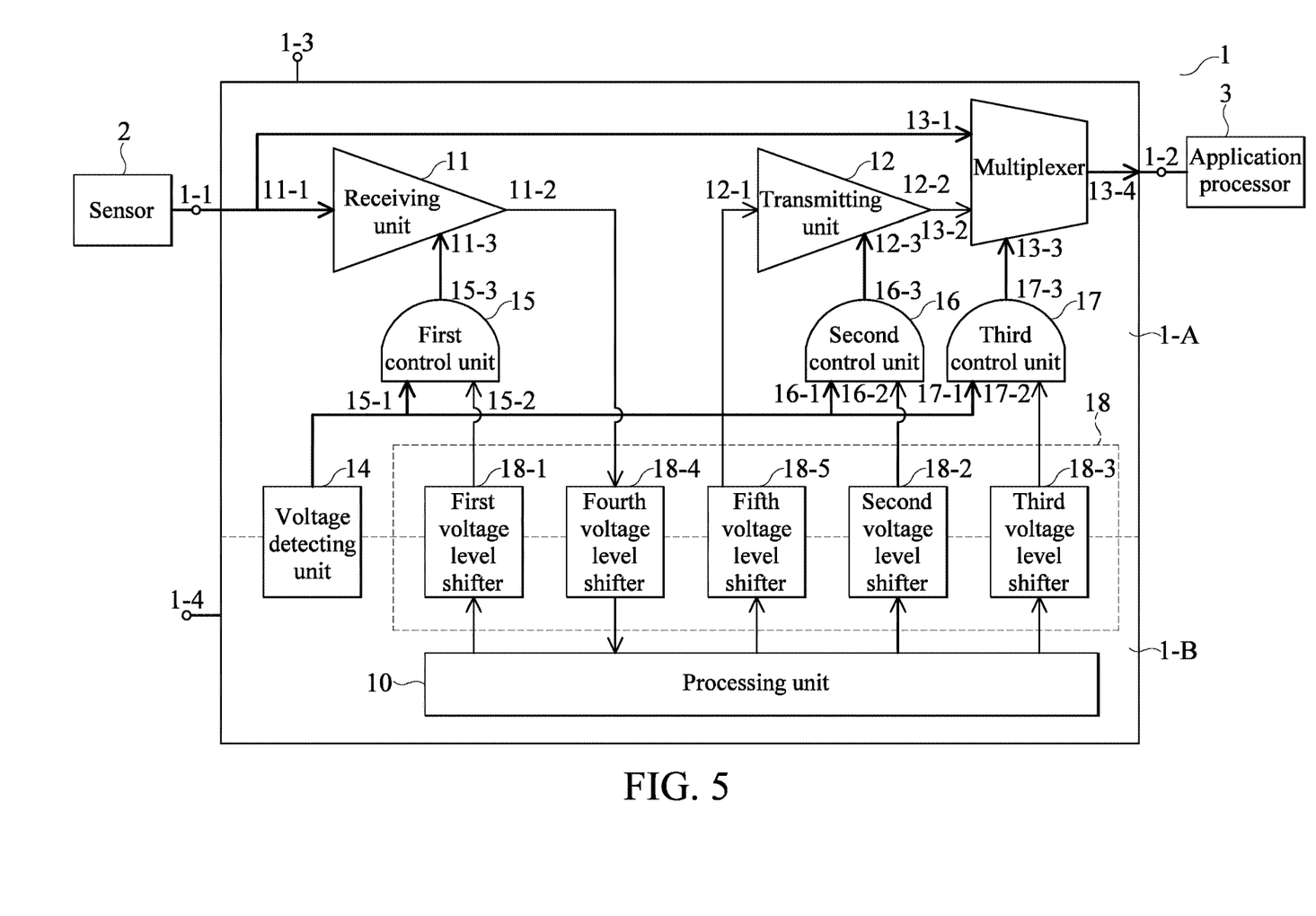
FIG. 5 is a block diagram showing the transmission interface module in a fourth mode according to the first embodiment of the present disclosure.
Figure 6:
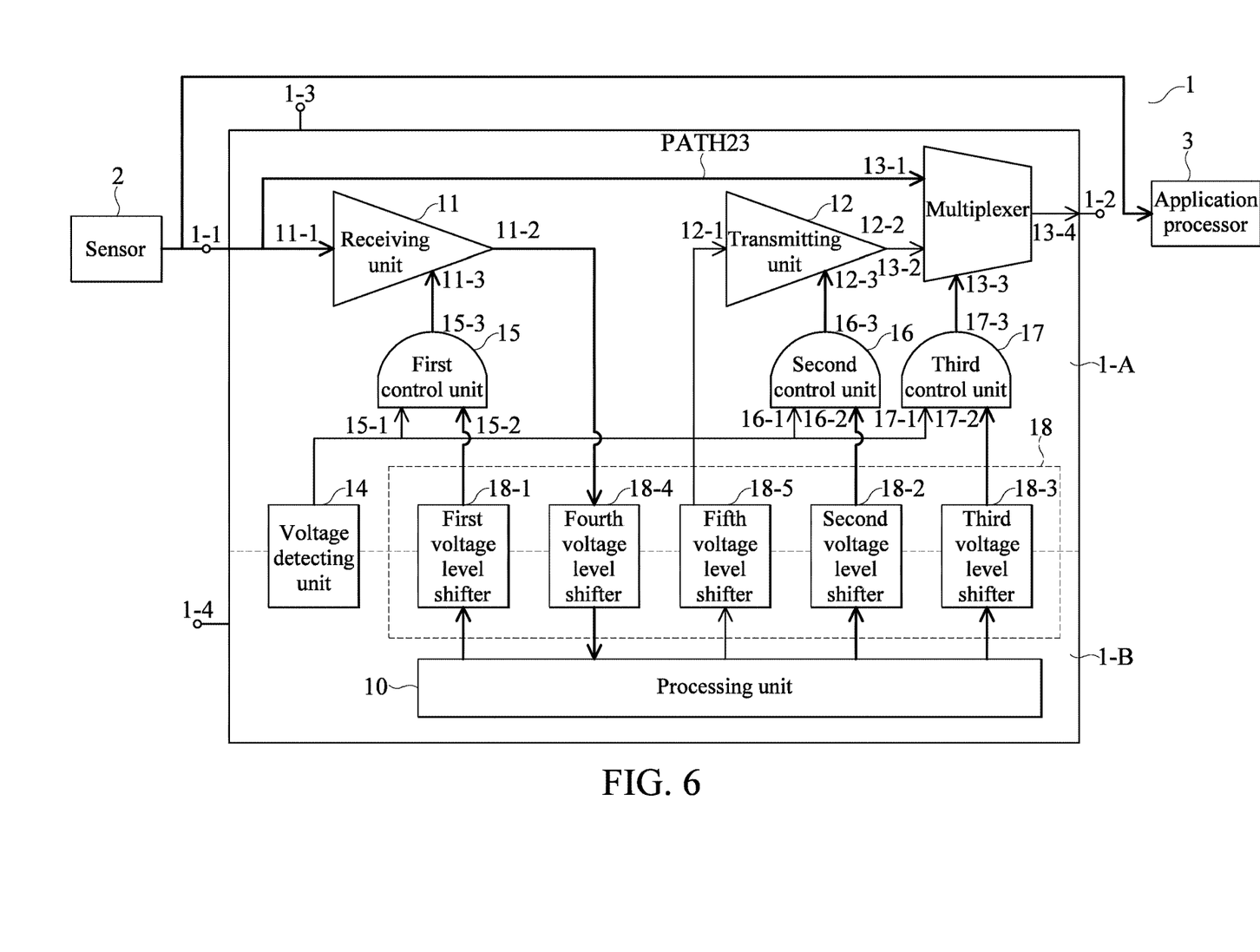
FIG. 6 is a block diagram showing the transmission interface module in a fifth mode according to the first embodiment of the present disclosure.
Figure 7:
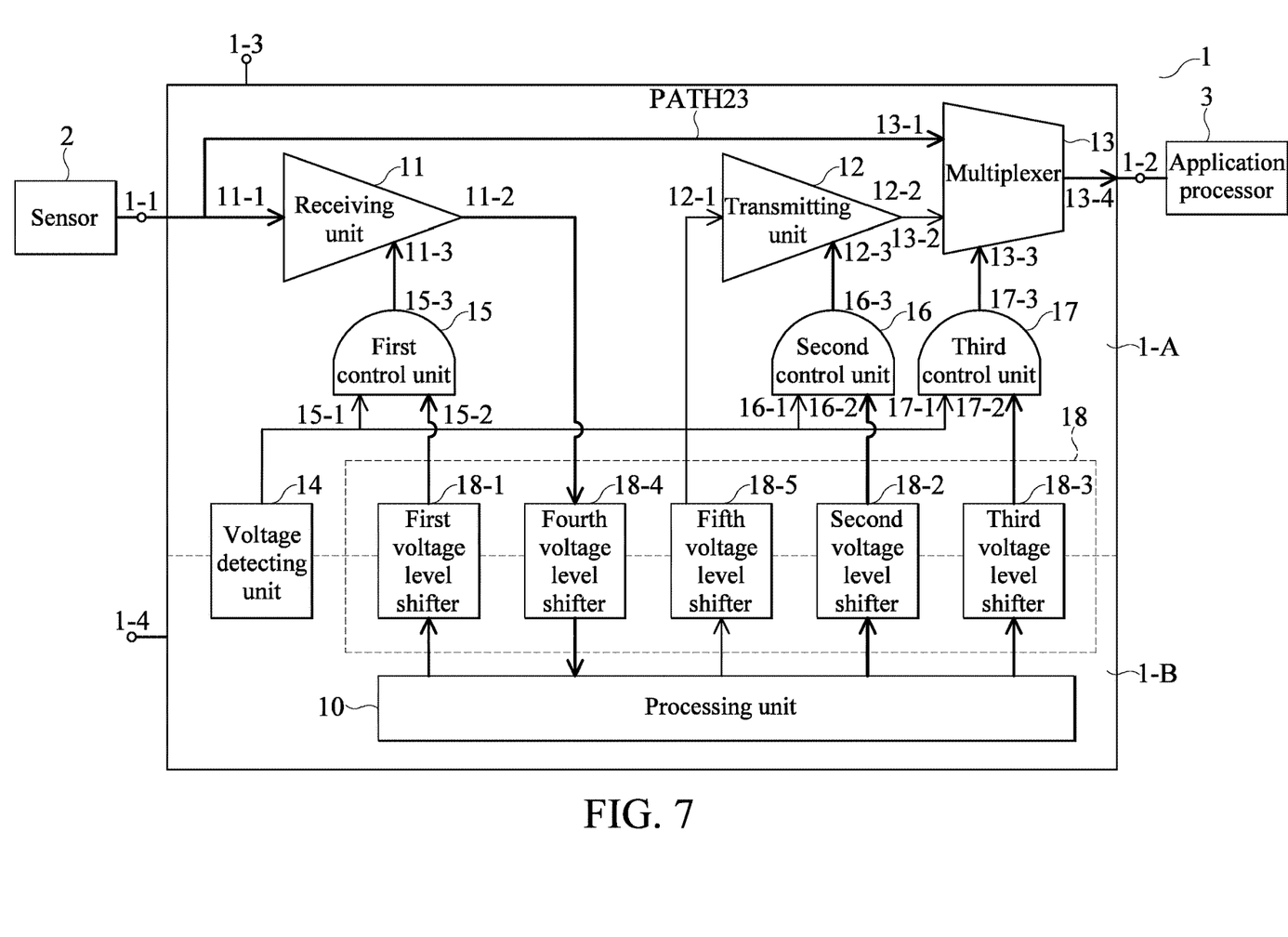
FIG. 7 is a block diagram showing the transmission interface module in a sixth mode according to the first embodiment of the present disclosure.
Figure 8:
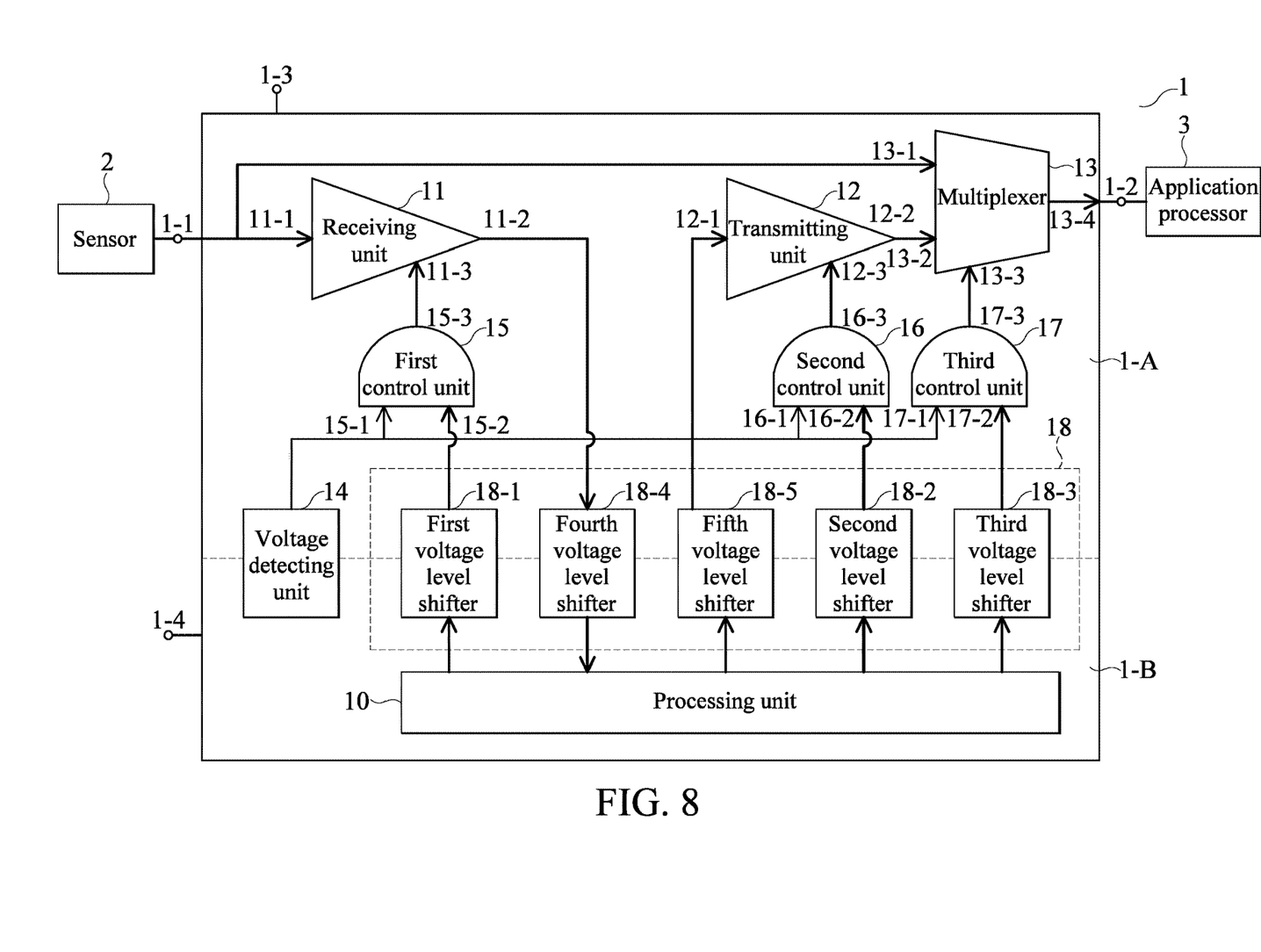
FIG. 8 is a block diagram showing the transmission interface module in a seventh mode according to the first embodiment of the present disclosure.

Referring to FIG. 2, FIG. 3, FIG. 4, FIG. 5, FIG. 6, FIG. 7 and FIG. 8, FIG. 2 is a block diagram showing the transmission interface module in a first mode according to an embodiment of the present disclosure. FIG. 3 is a block diagram showing the transmission interface module in a second mode according to an embodiment of the present disclosure. FIG. 4 is a block diagram showing the transmission interface module in a third mode according to an embodiment of the present disclosure. FIG. 5 is a block diagram showing the transmission interface module in a fourth mode according to an embodiment of the present disclosure. FIG. 6 is a block diagram showing the transmission interface module in a fifth mode according to an embodiment of the present disclosure. FIG. 7 is a block diagram showing the transmission interface module in a sixth mode according to an embodiment of the present disclosure. FIG. 8 is a block diagram showing the transmission interface module in a seventh mode according to an embodiment of the present disclosure.

In the embodiment, the transmission interface module 1 can operate in different operation modes, and each of the operation modes of the transmission interface module 1 will be described below. In addition, in FIG. 2, FIG. 3, FIG. 4, FIG. 5, FIG. 6, FIG. 7 and FIG. 8, the thickness of the line also represents the transmission of the signal. The thick line indicates that the signal is transmitted through the circuit, and the thin line indicates that there is no signal for transmission.

Referring to FIG. 2, when the transmission interface module 1 is in a first mode, the analog power terminal 1-3 and the digital power terminal 1-4 are turned on. In other words, the analog power terminal 1-3 and the digital power terminal 1-4 respectively receive a first voltage (not shown)

and a second voltage (not shown). The transmitting unit 12 is turned off, and the detecting signals received by the signal input terminal 1-1 are transmitted to the processing unit 10 through the receiving unit 11. The signal output terminal 1-2 of the transmission interface module 1 does not output any signal.

In other words, in the first mode, the transmission interface module 1 only receives the detecting signals of the sensor 2, and does not output any signal to the application processor 3. At this time, the detecting signals received by the transmission interface module 1 can be processed by a processing procedure of the processing unit 10.

Referring to FIG. 3, when the transmission interface module 1 is in a second mode, the analog power terminal 1-3 and the digital power terminal 1-4 are turned on. In other words, the analog power terminal 1-3 and the digital power terminal 1-4 respectively receive a first voltage (not shown) and a second voltage (not shown). In the second mode, the receiving unit 11 is turned off, and the processing unit 10 transmits the plurality of signals to the application processor 3 through the transmitting unit 12, the multiplexer 13, and the signal output terminal 1-2.

In the second mode, the transmission interface module 1 does not receive the detecting signals of the sensor 2, but transmits the processed signals or unprocessed signals of the processing unit 10 to the application processor 3 through the transmitting unit 12.

Referring to FIG. 4, when the transmission interface module 1 is in a third mode, the analog power terminal 1-3 and the digital power terminal 1-4 are turned on. In other words, the analog power terminal 1-3 and the digital power terminal 1-4 respectively receive a first voltage (not shown) and a second voltage (not shown). The receiving unit 11 and the transmitting unit 12 are turned off by the processing unit 10.

The received detecting signals of the signal input terminal 1-1 are transmitted to the application processor 3 through the multiplexer 13 and the signal output terminal 1-2. In other words, the detecting signals received by the signal input terminal 1-1 are transmitted to the application processor 3 through the first input terminal 13-1 of the multiplexer 13.

Referring to FIG. 5, when the transmission interface module 1 is in a fourth mode, the analog power terminal 1-3 is turned on. In other words, the analog power terminal 1-3 receives the first voltage (not shown). Furthermore, the digital power terminal 1-4 is turned off. In other words, the digital power terminal 1-4 does not receive the second voltage (not shown). In the fourth mode, the processing unit 10, the receiving unit 11, and the transmitting unit 12 are not in operation. The detecting signals received by the signal input terminal 1-1 are transmitted to the application processor 3 through the multiplex processing unit 13 and the signal output terminal 1-2.

Referring to FIG. 6, the sensor 2 is also electrically connected to the application processor 3 through a bypass path PATH23. When the transmission interface module 1 is in a fifth mode, the analog power terminal 1-3 and the digital power terminal 1-4 are turned on. In other words, the analog power terminal 1-3 and the digital power terminal 1-4 respectively receive the first voltage (not shown) and the second voltage (not shown). The transmitting unit 12 is turned off, and the detecting signals received by the signal input terminal 1-1 are transmitted to the processing unit 10 through the receiving unit 11. However, since the transmitting unit 12 and the multiplexer 13 are not in operation, the signal output terminal 1-4 of the transmission interface module 1 does not output any signals. The detecting signals of the sensor 2 are transmitted to the application processor 3 through the bypass path PATH23.

Referring to FIG. 7, when the transmission interface module 1 is in a sixth mode, the analog power terminal 1-3 and the digital power terminal 1-4 are turned on. In other words, the analog power terminal 1-3 and the digital power terminal 1-4 respectively receive a first voltage (not shown) and a second voltage (not shown). The transmitting unit 12 is turned off, and the detecting signals received by the signal input terminal 1-1 are transmitted to the processing unit 10 through the receiving unit 11. The detecting signals received by the signal input terminal 1-1 are transmitted to the application processor 3 through the multiplexer 13 and the signal output terminal 1-4.

The main difference between the fifth mode and the sixth mode of the transmission interface module 1 resides in the turn-on state or the turn-off state of the multiplexer 13. In the fifth mode, since a bypass path PATH23 is also disposed between the sensor 2 and the application processor 3, the multiplexer 13 of the transmission interface module 1 does not need to be in operation. In the sixth mode, since there is no bypass path PATH23, the multiplexer 13 of the transmission interface module 1 needs to operate in order to transmit the detecting signals of the sensor 2 to the application processor 3.

Referring to FIG. 8, when the transmission interface module 1 is in a seventh mode, the analog power terminal 1-3 and the digital power terminal 1-4 are turned on. In other words, the analog power terminal 13 and the digital power terminal 1-4 receive the first voltage (not shown) and the second voltage (not shown), respectively. The receiving unit 11 and the transmitting unit 12 are turned on, and the detecting signals received by signal input terminal 1-1 are transmitted to the processing unit 10 through the receiving unit 11. The processing unit 10 performs a processing procedure on the detecting signals. The processed detecting signals are transmitted to the application processor 3 through the transmitting unit 12, the multiplexer 13, and the signal output terminal 1-4.

Second Embodiment

Figure 9:
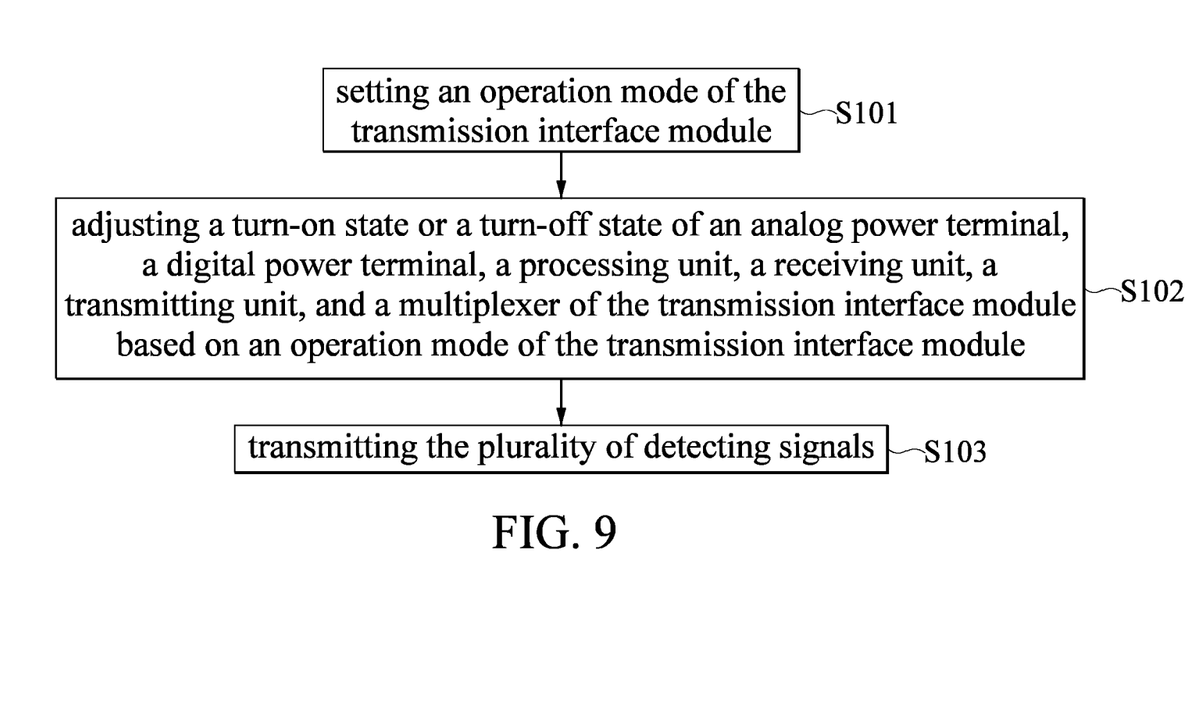
FIG. 9 is a flow chart showing a signal transmission method according to a second embodiment of the present disclosure.

Referring to FIG. 9, FIG. 9 is a flow chart showing a signal transmission method according to a second embodiment of the present disclosure.

A signal transmission method is further provided in the embodiment of the present disclosure, which is adapted for the transmission interface module 1 of the first embodiment. The structure and function of the transmission interface module described in the embodiment is the same as described in the previous embodiment, therefore, it is not described herein. In the embodiment, the signal transmission method includes the following steps:

setting an operation mode of the transmission interface module (step S101)

adjusting a turn-on state or a turn-off state of an analog power terminal, a digital power terminal, a processing unit, a receiving unit, a transmitting unit, and a multiplexer of the transmission interface module based on an operation mode of the transmission interface module (step S102); and transmitting the plurality of detecting signals (step S103).

In step S101, in the embodiment, the transmission interface module 1 includes seven modes, i.e., a first mode to a seventh mode.

In step S102 and step S103, the transmission interface module 1 adjusts the turn-on or turn-off of the analog power terminal 1-3, the digital power terminal 1-4, the signal input terminal 1-1, the signal output terminal 1-2, the processing unit 10, the receiving unit 11, the transmitting unit 12, and the multiplexer 13 for transmitting the detecting signal to the application processor 3 or the processing unit 10 of the transmission interface module 1, or transmitting the detecting signals processed by the processing unit 10 to the application processor 3.

When the transmission interface module 1 is in a first mode, the analog power terminal 1-3 and the digital power terminal 1-4 are turned on. In other words, the analog power terminal 1-3 and the digital power terminal. 1-4 respectively receive a first voltage (not shown) and a second voltage (not shown). The transmitting unit 12 is turned off, and the detecting signals received by the signal input terminal 1-1 are transmitted through the receiving unit 11 to the processing unit 10. The signal output terminal 1-2 of the transmission interface module 1 does not output any signal.

In other words, in the first mode, the transmission interface module 1 only receives the detecting signals of the sensor 2, and does not output any signal to the application processor 3. At this time, the detecting signals received by the transmission interface module 1 can be processed by a processing procedure of the processing unit 10.

When the transmission interface module 1 is in a second mode, the analog power terminal 1-3 and the digital power terminal 1-4 are turned on. In other words, the analog power terminal 1-3 and the digital power terminal 1-4 respectively receive a first voltage (not shown) and a second voltage (not shown). In the second mode, the receiving unit 11 is turned off, and the processing unit 10 transmits a plurality of signals to the application processor 3 through the transmitting unit 12, the multiplexer 13, and the signal output terminal 1-4.

In the second mode, the transmission interface module 1 does not receive the detecting signals of the sensor 2, but transmits the processed signals or unprocessed signal of the processing unit 10 to the application processor 3 through the transmitting unit 12.

When the transmission interface module 1 is in a third mode, the analog power terminal 1-3 and the digital power terminal 1-4 are turned on. In other words, the analog power terminal 1-3 and the digital power terminal. 1-4 will respectively receive a first voltage (not shown) and a second voltage (not shown), and the processing unit 10 controls the receiving unit 11 and the transmitting unit 12 to be turned off. The detecting signals received by the signal input terminal 1-1 are transmitted to the application processor 3 through the multiplexer 13 and the signal output terminal 1-2. In other words, the detecting signals received by the signal input terminal 1-1 are transmitted to the application processor 3 through the first input terminal 13-1 of the multiplexer 13.

When the transmission interface module 1 is in a fourth mode, the analog power terminal 1-3 is turned on. In other words, the analog power terminal 1-3 receives the first voltage (not shown). Furthermore, the digital power terminal 1-4 is turned off. In other words, the digital power terminal 1-4 does not receive the second voltage (not shown). In the fourth mode, the processing unit 10, the receiving unit 11, and the transmitting unit 12 are not in operation. The detecting signals received by the signal input terminal 1-1 are transmitted to the application processor 3 through the multiplexer 13 and the signal output terminal 1-2.

When the transmission interface module 1 is in a fifth mode, the analog power terminal 1-3 and the digital power terminal 1-4 are turned on. In other words, the analog power terminal 1-3 and the digital power terminal. 1-4 respectively receive a first voltage (not shown) and a second voltage (not shown). However, in the fifth mode, a bypass path PATH23 is provided between the sensor 2 and the application processor 3.

In the fifth mode, the transmitting unit 12 is turned off, and the detecting signals received by the signal input terminal 1-1 are transmitted to the processing unit 10 through the receiving unit 11. Since the transmitting unit 12 and the multiplexer 13 are not in operation, the signal output terminal 1-4 of the transmission interface module 1 do not output signals. The detecting signals of the sensor 2 are transmitted to the application processor 3 through the bypass path PATH23.

When the transmission interface module 1 is in the sixth mode, the analog power terminal 1-3 and the digital power terminal 1-4 are turned on. In other words, the analog power terminal 1-3 and the digital power terminal. 1-4 receive the first voltage (not shown) and the second voltage (not shown), respectively. The transmitting unit 12 is turned off, and the detecting signals received by the signal input terminal 1-1 are transmitted to the receiving unit 11 to processing unit 10. The detecting signals received by the signal input terminal 1-1 are transmitted to the application processor 3 through the multiplexer 13 and the signal output terminal 1-4.

The main difference between the fifth mode and the sixth mode of the transmission interface module 1 resides in the turn-on state or the turn-off state of the multiplexer 13. In the fifth mode, since the bypass path PATH23 is provided between the sensor 2 and the application processor 3, the multiplexer 13 of the transmission interface module 1 does not need to operate. In the sixth mode, since there is no bypass path PATH23, the multiplexer 13 of the transmission interface module 1 needs to operate in order to transmit the detecting signals of the sensor 2 to the application processor 3.

When the transmission interface module 1 is in a seventh mode, the analog power terminal 1-3 and the digital power terminal 1-4 are turned on. In other words, the analog power terminal 1-3 and the digital power terminal 1-4 receive the first voltage (not shown) and the second voltage (not shown), respectively.

The receiving unit 11 and the transmitting unit 12 are turned on, and the detecting signals received by the signal input terminal 1-1 are transmitted to the processing unit 10. The processing unit 10 performs a processing procedure on the plurality of detecting signals, and the processed detecting signals are transmitted to the application processor 3 through the transmitting unit 12, the multiplexer 13, and the signal output terminal 1-4.

In the above operation modes, different components are respectively turned off or turned on to perform different operation modes. The minimum power consumption of the transmission interface module 1 can be reduced to 50 uW, and the maximum power consumption is also less than 1 mW.

In conclusion, the transmission interface module provided by the present disclosure can greatly reduce power consumption by turning on or turning off components, such as the receiving unit, the transmitting unit, the multiplexer, and the processing unit. Furthermore, the heat dissipation efficiency is also improved, and a wider variety of designs can be provided to customers through multiple operation modes.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated.

Alternative embodiments will become apparent to those skilled in the art to which the present disclosure pertains without departing from its spirit and scope.

What is claimed is:

1. A transmission interface module electrically connected to a sensor and an application processor, and the transmission interface module comprising:
   a signal input terminal electrically connected to the sensor and receiving a plurality of detecting signals transmitted by the sensor;
   a signal output terminal electrically connected to the application processor, and outputting the plurality of detecting signals to the application processor;
   an analog power terminal electrically connected to a first voltage;
   a digital power terminal electrically connected to a second voltage;
   a receiving unit including an input terminal, an output terminal, and a control terminal, wherein the input terminal of the receiving unit is electrically connected to the signal input terminal;
   a transmitting unit including an input terminal, an output terminal, and a control terminal;
   a multiplexer including a first input terminal, a second input terminal, a control terminal, and an output terminal, wherein the first input terminal of the multiplexer is electrically connected to the signal input terminal, the second input terminal of the multiplexer is electrically connected to the output terminal of the transmitting unit, and the output terminal of the multiplexer is electrically connected to the signal output terminal; and
   a processing unit electrically connected to the receiving unit, the transmitting unit, and the multiplexer, wherein the processing unit receives the second voltage for operation;
   wherein the output terminal and the control terminal of the receiving unit are electrically connected to the processing unit, the input terminal and the control terminal of the transmitting unit are electrically connected to the processing unit, and the control terminal of the multiplexer is electrically connected to the processing unit;
   wherein the first voltage is applied to provide electrical energy for operation of the receiving unit, the transmitting unit, and the multiplexer;
   wherein the transmission interface module respectively adjusts a turn-on state or a turn-off state of the analog power terminal, the digital power terminal, the processing unit, the receiving unit, the transmitting unit, and the multiplexer through a plurality of operation modes to transmit the detecting signals.

2. The transmission interface module of claim 1, further comprising:
   a voltage detecting unit detecting the first voltage of the analog power terminal and the second voltage of the digital power terminal.

3. The transmission interface module of claim 2, further comprising:
   a first control unit including a first input terminal, a second input terminal, and an output terminal, wherein the second input terminal of the first control unit is electrically connected to the processing unit through a first voltage level shifter, and the output terminal of the first control unit is electrically connected to the control terminal of the receiving unit;
   a second control unit including a first input terminal, a second input terminal, and an output terminal, wherein the second input terminal of the second control unit is electrically connected to the processing unit through a second voltage level shifter, and the output terminal of the second control unit is electrically connected to the control terminal of the transmitting unit; and
   a third control unit including a first input terminal, a second input terminal, and an output terminal, wherein the second input terminal of the third control unit is electrically connected to the processing unit through a third voltage level shifter, and the output terminal of the third control unit is electrically connected to the control terminal of the multiplexer;
   wherein the voltage detecting unit is electrically connected to the first input terminal of the first control unit, the first input terminal of the second control unit, and the first input terminal of the third control unit;
   wherein the transmission interface module further includes a fourth voltage level shifter and a fifth voltage level shifter, the fourth voltage level shifter is electrically connected to the output terminal of the receiving unit and the processing unit, and the fifth voltage level shifter is electrically connected to the input terminal of the transmitting unit and the processing unit.

4. The transmission interface module of claim 3, wherein the sensor is further electrically connected to the application processor through a bypass path.

5. The transmission interface module of claim 4, wherein when the transmission interface module is in a fifth mode, the analog power terminal and the digital power terminal are turned on for receiving the first voltage and the second voltage, respectively, the transmitting unit is turned off, the detecting signals received by the signal input terminal are transmitted to the processing unit, the signal output terminal of the transmission interface module does not output any signal, and the detecting signals of the sensor are transmitted to the application processor through the bypass path.

6. The transmission interface module of claim 3, wherein when the transmission interface module is in a first mode, the analog power terminal and the digital power terminal are turned on for receiving the first voltage and the second voltage, respectively, the transmitting unit is turned off, the detecting signals received by the signal input terminal are transmitted to the processing unit through the receiving unit, and the signal output terminal of the transmission interface module does not output any signal.

7. The transmission interface module of claim 3, wherein when the transmission interface module is in a second mode, the analog power terminal and the digital power terminal are turned on for receiving the first voltage and the second voltage, respectively, the receiving unit is turned off, and the processing unit transmits signals to the application processor through the transmitting unit, the multiplexer, and the signal output terminal.

8. The transmission interface module of claim 3, wherein when the transmission interface module is in a third mode, the analog power terminal and the digital power terminal are turned on for receiving the first voltage and the second voltage, respectively, the receiving unit and the transmitting unit are turned off the processing unit, and the detecting signals received by the signal input terminal are transmitted to the application processor through the multiplexer and the signal output terminal.

9. The transmission interface module of claim 3, wherein when the transmission interface module is in a fourth mode, the analog power terminal is turned on for receiving the first voltage, the digital power terminal is turned off, the digital power terminal of the transmission interface module does not receive the second voltage, the processing unit, the receiving unit, and the transmitting unit are not in a operation mode, and the detecting signals received by the signal input terminal are transmitted to the application processor through a multiplexer and the signal output terminal.

10. The transmission interface module of claim 3, wherein when the transmission interface module is in a sixth mode, the analog power terminal and the digital power terminal are turned on for receiving the first voltage and the second voltage, respectively, the transmitting unit is turned off, the detecting signals received by the signal input terminal are transmitted to the processing unit, the detecting signals received by the signal input terminal are transmitted to the application processor through the multiplexer and the signal output terminal.

11. The transmission interface module of claim 3, wherein when the transmission interface module is in a seventh mode, the analog power terminal and the digital power terminal are turned on for receiving the first voltage and the second voltage, respectively, the receiving unit and the transmitting unit are turned on, and the detecting signals received by the signal input terminal are transmitted to the processing unit through the receiving unit, the processing unit performs a processing procedure on the detecting signals, and the detecting signals after the processing procedure are transmitted to the application processor through the transmitting unit, the multiplexer, and the signal output terminal.

12. A signal transmission method using a transmission interface module, wherein the transmission interface module is electrically connected to a sensor and an application processor, and the transmission interface module receives a plurality of detecting signals of the sensor, the transmission interface module includes a signal input terminal, a signal output terminal, an analog power terminal, a digital power terminal, a receiving unit, a transmitting unit, a multiplexer, and a processing unit; the signal input terminal is electrically connected to the sensor, and receives the detecting signals transmitted by the sensor; the signal output terminal is electrically connected to the application processor, and outputs the detecting signals to the application processor; the receiving unit is electrically connected to the signal input terminal and the processing unit, the transmitting unit is electrically connected to the multiplexer and the processing unit, and the multiplexer is electrically connected to the signal input terminal, the signal output terminal, and the processing unit; the signal transmission method comprising:
setting an operation mode of the transmission interface module;
adjusting a turn-on state or a turn-off state of the analog power terminal, the digital power terminal, the processing unit, the receiving unit, the transmitting unit, and the multiplexer based on the operation mode of the transmission interface module; and
transmitting the detecting signals.

13. The signal transmission method of claim 12, wherein the sensor is further electrically connected to the application processor through a bypass path.

14. The signal transmission method of claim 13, wherein when the transmission interface module is in a first mode, the analog power terminal and the digital power terminal are turned on for respectively receiving the first voltage and the second voltage, the transmitting unit is turned off, the detecting signals received by the signal input terminal are transmitted to the processing unit through the receiving unit, and the signal output terminal of the transmission interface module does not output any signal.

15. The signal transmission method of claim 14, wherein when the transmission interface module is in a fifth mode, the analog power terminal and the digital power terminal are turned on for respectively receiving the first voltage and the second voltage, the transmitting unit is turned off, the detecting signals received by the signal input terminal are transmitted to the processing unit, the signal output terminal of the transmission interface module does not output any signal, and the detecting signals of the sensor are transmitted to the application processor through the bypass path.

16. The signal transmission method of claim 13, wherein when the transmission interface module is in a second mode, the analog power terminal and the digital power terminal are turned on for respectively receiving the first voltage and the second voltage, the receiving unit is turned off, and the processing unit transmits signals to the application processor through the transmitting unit, the multiplexer, and the signal output terminal.

17. The signal transmission method of claim 13, wherein when the transmission interface module is in a third mode, the analog power terminal and the digital power terminal are turned on for respectively receiving the first voltage and the second voltage, the receiving unit and the transmitting unit are turned off by the processing unit, and the detecting signals received by the signal input terminal are transmitted to the application processor through the multiplexer and the signal output terminal.

18. The signal transmission method of claim 13, wherein when the transmission interface module is in a fourth mode, the analog power terminal is turned on for receiving the first voltage, the digital power terminal is turned off, the digital power terminal of the transmission interface module does not receive the second voltage, the processing unit, the receiving unit, and the transmitting unit are not in a operation mode, and the detecting signals received by the signal input terminal are transmitted to the application processor through a multiplexer and the signal output terminal.

19. The signal transmission method of claim 13, wherein when the transmission interface module is in a sixth mode, the analog power terminal and the digital power terminal are turned on for respectively receiving the first voltage and the second voltage, the transmitting unit is turned off, the detecting signals received by the signal input terminal are transmitted to the processing unit, and the detecting signals received by the signal input terminal are transmitted to the application processor through the multiplexer and the signal output terminal.

20. The signal transmission method of claim 13, wherein when the transmission interface module is in a seventh mode, the analog power terminal and the digital power terminal are turned on for respectively receiving the first voltage and the second voltage, the receiving unit and the transmitting unit are turned on, the detecting signals received by the signal input terminal are transmitted to the processing unit through the receiving unit, the processing unit performs a processing procedure on the detecting signals, and after the processing procedure, the detecting signals are transmitted to the application processor through the transmitting unit, the multiplexer, and the signal output terminal.

* * * * *